(12) United States Patent
Ohta et al.

(10) Patent No.: US 7,872,253 B2
(45) Date of Patent: Jan. 18, 2011

(54) THERMOELECTRIC MATERIAL, INFRARED SENSOR AND IMAGE FORMING DEVICE

(75) Inventors: Hiromichi Ohta, Nagoya (JP); Kunihito Koumoto, Nagoya (JP); Yoriko Mune, Nagoya (JP)

(73) Assignee: National University Corporation Nagoya University, Nagoya-shi (JP)

( * ) Notice: Subject to any disclaimer, the term of this patent is extended or adjusted under 35 U.S.C. 154(b) by 245 days.

(21) Appl. No.: 12/227,242

(22) PCT Filed: May 11, 2007

(86) PCT No.: PCT/JP2007/059766
§ 371 (c)(1),
(2), (4) Date: Nov. 12, 2008

(87) PCT Pub. No.: WO2007/132782
PCT Pub. Date: Nov. 22, 2007

(65) Prior Publication Data
US 2009/0173932 A1    Jul. 9, 2009

(30) Foreign Application Priority Data
May 12, 2006   (JP) ............................. 2006-133179

(51) Int. Cl.
*H01L 29/66* (2006.01)
*H01L 35/14* (2006.01)
*H01L 21/20* (2006.01)

(52) U.S. Cl. ................. 257/15; 257/432; 257/E29.168; 257/E21.09; 257/E31.033; 257/E29.322; 136/239; 250/226; 438/478

(58) Field of Classification Search ................... 257/10, 257/14, 11, 15, 21, 189, 432, 459, E29.168, 257/E21.09, E31.033, E31.054, E29.322, 257/E31.019, E31.032; 136/239; 250/226, 250/338.4; 438/478
See application file for complete search history.

(56) References Cited

FOREIGN PATENT DOCUMENTS

| JP | 07-082097 | 3/1995 |
|---|---|---|
| JP | 08-222775 | 8/1996 |
| JP | 08-231223 | 9/1996 |
| JP | 10-032353 | 2/1998 |
| JP | 2003-257709 | 9/2003 |
| JP | 2004-193200 | 7/2004 |
| JP | 2004-363576 | 12/2004 |

OTHER PUBLICATIONS

L. D. Hicks et al., "Effect of quantum-well structures on the thermoelectric figure of merit," Phys. Rev. vol. 47, No. 19, B47, May 15, 1993, pp. 12727-12731.

(Continued)

*Primary Examiner*—Victor A Mandala
*Assistant Examiner*—Whitney Moore
(74) *Attorney, Agent, or Firm*—Edwards Angell Palmer & Dodge LLP

(57) ABSTRACT

A thermoelectric conversion material includes a superlattice structure produced by laminating a barrier layer containing insulating $SrTiO_3$, and a quantum well layer containing $SrTiO_3$ which has been converted into a semiconductor by doping an n-type impurity therein. The quantum well layer has a thickness 4 times or less the unit lattice thickness of $SrTiO_3$ which has been converted into a semiconductor by doping an n-type impurity therein.

20 Claims, 8 Drawing Sheets

OTHER PUBLICATIONS

M. S. Dresselhaus et al., "Low Dimensional Thermoelectrics," Proceedings of the 16th International Conference on Thermoelectrics, 1997, pp. 12-19.

Venkatasubramanian, R. et al., "Thin-film thermoelectric devices with high room-temperature figures of merit," Nature 413, Oct. 11, 2001, pp. 597-602.

Harman, T. C. et al., "Quantum dot superlattice thermoelectric materials and devices," Science 297, Sep. 27, 2002, pp. 2229-2232.

Hsu, K. F. et al., "Cubic $AgPb_mSbTe_{2+m}$: Bulk thermoelectric materials with high figure of merit," Science 303, Feb. 6, 2004, pp. 818-821.

Ohta, S. et al., "Large thermoelectric performance of heavily Nb-doped $SrTiO_3$ epitaxial film at high temperature," Appl. Phys. Lett. 87, 2005, pp. 092108-1-092108-3.

Keisuke Shibuya et al. "Single crystal $SrTiO_3$ field-effect transistor with an atomically flat amorphous $CaHfO_3$ gate insulator," Applied Physics Letters, vol. 85 No. 3, Jul. 19, 2004, pp. 425-427.

Terasaki, I. et al., "Large thermoelectric power in $NaCo_2O_4$ single crystals," Phys. Rev. B56, Nov. 15, 1997, pp. 12685-12687.

Funahashi, R. et al., "An Oxide Single Crystal with High Thermoelectric performance in Air," Jpn. J. Appl. Phys. vol. 39, Nov. 15, 2000, L1127-L1129.

International Search Report mailed Aug. 14, 2007, issued on PCT/JP2007/059766.

THERMOELECTRIC MATERIAL, INFRARED SENSOR AND IMAGE FORMING DEVICE

TECHNICAL FIELD

The present invention relates to a thermoelectric conversion material, a production method for a thermoelectric conversion material, a thermoelectric conversion device, an infrared sensor, a light receiving apparatus and an image producing apparatus.

BACKGROUND ART

In recent years, the awareness of the earth's environmental problems has increased. In order to reduce the amount of carbon dioxide exhaust, interest has been growing in thermoelectric conversion devices that exploit the Seebeck effect for providing an electrical generating system that uses unutilized waste energy. The thermoelectric conversion devices are in commercial use as auxiliary batteries for interplanetary probes, and the effective use of this energy has an enormous potential because electrical power can be obtained, for example, from geothermal heat, the waste heat from factories, solar heat, the combustion heat of fossil fuels, and the like.

When applying a temperature gradient to both ends of semiconductor samples, a thermoelectromotive force that is proportional to the temperature gradient is generated. This is a phenomenon referred to as the Seebeck effect and the proportionality coefficient (the thermoelectromotive force per 1 K temperature gradient) is called the Seebeck coefficient. The performance of a thermoelectric conversion material is generally evaluated by using the dimensionless figure of merit ZT. When the Seebeck coefficient, which indicates the electromotive force of the thermoelectric conversion material at an absolute temperature T, is denoted by S, the electrical conductivity is denoted by $\sigma$, and the thermal conductivity is denoted by $\kappa$, the performance of the thermoelectric conversion material is represented by the dimensionless figure of merit $ZT=T(S^2\sigma/\kappa)$. The characteristics as a thermoelectric conversion material become increasingly superior with an increasing value for ZT.

In a thermoelectric conversion device, generally thermocouples are formed by p-type and n-type thermoelectric conversion materials that are bonded by a metal. These thermocouples are coupled and used in the form of modules in which thermocouples are connected serially in order to obtain the desired voltage. In consideration of the level of the conversion efficiency, the n-type and p-type thermoelectric conversion materials that are used in such thermoelectric conversion devices frequently use $Bi_2Te_3$ intermetallic compound single crystals or polycrystals. Although it is known that $Bi_2Te_3$ exhibits the highest thermoelectric conversion performance (ZT=1) in a temperature range near room temperature, since a large temperature gradient cannot be applied thereto, the conversion efficiency thereof as a power generating application is low, so that its application is nothing more than a cooling device for a portable refrigerator, for example, utilizing the Peltier effect.

Thanks to the fabrication of semiconductor quantum well in 1993 by a research group led by Dresselhaus et al. of the Massachusetts Institute of Technology in the US, a drastic improvement in the thermoelectric conversion performance was predicted theoretically (Non-patent Document 1), and partially demonstrated experimentally (Non-patent Document 2). According to the details of the theory, because the density of state is increased by confining the carriers in a quantum well (having a well width of around a few nanometers), the square of the Seebeck coefficient increases in inverse proportion to the well width.

Since Hicks et al. have proposed their theory, new ideas such as a multiple quantum well and a quantum dot superlattice have been proposed and several high performance thermoelectric conversion materials have been developed. For example, Venkatasubramanian et al. have succeeded in reducing largely the thermal conductivity almost without influencing on the electronic system by producing a $Bi_2Te_3/Sb_2The_3$ superlattice and have developed a thermoelectric conversion material having a ZT of up to 2.4 at room temperature (Non-patent Document 3). In addition, Harman et al. have achieved a ZT of up to 1.6 at room temperature by producing a $PbSe_{0.98}Te_{0.02}/PbTe$ quantum dot superlattice (Non-patent Document 4). Further, Hsu et al. have found that in a bulk $AgPb_mSbTe_{2+m}$ alloy, a quantum dot structure is formed and have achieved a ZT of up to 2.2 at 800 K (Non-patent Document 5).

However, since the above-described thermoelectric conversion materials contain rare heavy metal elements as main components, are easily decomposed at a high temperature of 200° C. or more and have high toxicity, they are apparently unsuitable for a power generating application at a high temperature around 1000 K at which a large converting efficiency can be expected.

Under such background, recently, high temperature thermoelectric conversion materials using metal oxides are actively developed. The metal oxide is the most stable form on the earth and many types of the metal oxide are thermally and chemically stable at a higher temperature around 1000 K. For example, $SrTiO_3$ can be easily converted into an n-type semiconductor by substitutionally doping $SrTiO_3$ with high-valence ions, such as Nb, and it is known that it has a ZT of up to 0.08 at room temperature and a ZT of up to 0.37 which is the highest with n-type metal oxides at 1000 K (Non-patent Document 6).

In addition, as a background art related to the above things, Patent Document 1 also should be referred to.

[Non-Patent Document 1]
L. D. Hicks and M. S. Dresselhaus, Phys. Rev. B47, 12727 (1993)

[Non-Patent Document 2]
M. S. Dresselhaus et al., Proceedings of the 16th International Conference on Thermoelectrics, 12 (1997)

[Non-Patent Document 3]
Venkatasubramanian, R., Siivola, E., Colpitts. T. & O'Quinn. B., Thin-film thermoelectric devices with high room-temperature figures of merit, Nature 413, 597-602 (2001)

[Non-Patent Document 4]
Harman, T. C., Taylor, P. J., Walsh, M. P. & LaForge, B. E., Quantum dot superlattice thermoelectric materials and devices, Science 297, 2229-2232 (2002)

[Non-Patent Document 5]
Hsu, K. F., Loo, S., Guo, F., Chen, W., Dyck, J. S., Uher, C., Hogan, T., Polychroniadis, E. K., & Kanatzidis, M. C., Cubic $AgPb_mSbTe_{2+m}$: Bulk thermoelectric materials with high figure of merit, Science 303, 818-821 (2004)

[Non-Patent Document 6]
Ohta, S., Nomura, T., Ohta, H., Hirano, M., Hosono, H. & Koumoto, K., Large thermoelectric performance of heavily Nb-doped $SrTiO_3$ epitaxial film at high temperature, Appl. Phys. Lett. 87, 092108-092111 (2005)

[Non-Patent Document 7]

Keisuke Shibuya et al. Single crystal $SrTiO_3$ field-effect transistor with an atomically flat amorphous $CaHfO_3$ gate insulator, Applied Physics Letters Volume 85 Number 3 (2004)

[Patent Document 1]

Japanese Patent Application Publication No. JP-A-8-231223

DISCLOSURE OF THE INVENTION

Problems to be Solved by the Invention

Although $SrTiO_3$ exhibits an excellent figure of merit ZT as a thermoelectric conversion material, the merit thereof is not yet satisfactory, so that the enhancement of the merit is strongly required. For example, in order to achieve high efficiency thermoelectric power generation, the figure of merit ZT=0.37 of $SrTiO_3$ at 1000 K is far from satisfactory and it is necessary to design a material having a ZT of at least more than 1.

Means to Solve the Problems

The present inventors have made extensive and intensive studies toward enhancing the figure of merit of $SrTiO_3$ and have obtained the following findings. Specifically, by constituting a superlattice structure including a barrier layer containing the $SrTiO_3$ (insulator) and a quantum well layer containing $SrTiO_3$ which has been converted into a semiconductor by doping an n-type impurity therein, a thermoelectric conversion material having specific characteristics has been obtained. In other words, the present invention is defined as follows.

A thermoelectric conversion material containing a superlattice structure produced by laminating a barrier layer contains insulating $SrTiO_3$ and a quantum well layer containing $SrTiO_3$ which has been converted into a semiconductor by doping an n-type impurity therein. In this thermoelectric conversion material, the quantum well layer has preferably a thickness less than 4 times the unit lattice thickness of $SrTiO_3$ which has been converted into a semiconductor by doping an n-type impurity therein.

With the defined thermoelectric conversion material, the Seebeck coefficient increases "linearly" in inverse proportion to the thickness of the quantum well layer (well width). On the contrary, in a thermoelectric conversion material having a superlattice structure introduced in background art, the "square" of the Seebeck coefficient increases in inverse proportion to the thickness of the quantum well layer.

The Seebeck coefficient increases linearly in inverse proportion to the thickness of the quantum well and as a result, when the thickness of the quantum well layer has been made thinner as possible, that is, to the thickness of a $SrTiO_3$ unit lattice (0.3905 nm), the quantum well layer has exhibited a Seebeck coefficient which is four times or more that in bulk and the figure of merit ZT thereof has exceeded 1. Here, since both the quantum well layer and the barrier layer contain $SrTiO_3$, it is not so difficult to epitaxially-grow an extremely thin (of unit lattice thickness) quantum well layer on the barrier layer.

The reason for obtaining the above effect is assumed as follows.

The lower end of the conduction band of $SrTiO_3$, that is, an electron orbital along which a carrier electron conducts is a triple-degenerated Ti 3d-$t_{2g}$ orbital (the $t_{2g}$ orbital is a generic name of three types ($d_{xy}$, $d_{zx}$, $d_{yz}$) of orbitals having the same energy with a large directivity). Between two Ti atoms adjacent to each other in a $SrTiO_3$ crystal, parts of $t_{2g}$ orbitals overlap, which become a field of electron conduction. It is considered that while in general semiconductors, since spherically symmetric metal s orbitals having no directivity largely overlap to form a conduction band, carrier electrons move easily in the conduction band (carrier effective mass is small) and a quantum confinement effect of carrier electrons due to forming of a multiple quantum well is unlikely to be exhibited, in $SrTiO_3$, as described above, carrier electrons are likely to be localized (carrier effective mass is large) and quantum confinement is easily achieved by forming a multiple quantum well.

An artificial superlattice is produced by alternatively growing thin films of insulating $SrTiO_3$ and $SrTiO_3$ doped with a high density carrier on a substrate of a perovskite-type oxide single crystal such as $LaAlO_3$ which is an absolute insulator by a thin film producing process such as pulse laser evaporation. At this time, in order to cause the layer doped with a high density carrier to serve as a quantum well, a dielectric oxide layer doped with a high density carrier is prepared to have a thickness of 1 nm or less, preferably of 4 unit lattice thickness or less. In the prepared artificial superlattice, carrier electrons are confined in a $SrTiO_3$ layer doped with a high density carrier which becomes a carrier conducting layer, as a quantum well. At this time, the concentration of generated carriers is $10^{21}$ cm$^{-3}$ order, and although the bulk exhibits a Seebeck coefficient of about 0.15 mVK$^{-1}$, since actually the quantum Seebeck effect is caused, when a dielectric oxide layer doped with a high density carrier has a thickness of 0.8 nm, it exhibits 0.3 mVK$^{-1}$, which is 2.2 times the Seebeck coefficient of the bulk. When the dielectric oxide layer has a thickness of 0.4 nm, it exhibits 0.6 mVK$^{-1}$, which is 4.4 times the Seebeck coefficient in bulk. In addition, as the conductivity of the dielectric oxide layer, a high conductivity of about 2,000 Scm$^{-1}$ can be maintained corresponding to a carrier concentration of $10^{21}$ cm$^{-3}$ and a mobility of 6 cm$^2$V$^{-1}$ s$^{-1}$. In other words, an ideal large voltage and low internal resistance for a thermoelectric conversion material can be achieved.

The theory proposed by Hick et al. in 1993 and the present invention differ decisively from each other in a relationship between a quantum well width and a Seebeck coefficient. While in the theory of Hick et al., the square of the Seebeck coefficient increases in inverse proportion to the well width, in a multiple quantum well of the present invention containing the insulating $SrTiO_3$ and $SrTiO_3$ doped with a high density carrier, when the well width becomes 4 unit lattice thickness (1.562 nm) or less, the Seebeck coefficient increases linearly in inverse proportion to the well width (see FIG. 3). This is considered to be because the overlap of a $t_{2g}$ orbital forming the above-described conduction band of $SrTiO_3$ differs from that of an s orbital of a semiconductor and forms a pseudo-one dimensional conduction path.

The $SrTiO_3$ thin film can be produced by a gas phase method using at least one method selected from a sputtering method, a CVD method, an MBE method and a pulse laser deposition method, or a liquid phase method represented by a sol-gel method.

As the substrate, a perovskite-type oxide single crystal such as $LaAlO_3$, $BaTiO_3$, $KTaO_3$, $SrTiO_3$, LSAT, $CaNdAlO_4$, and $SrLaAlO_4$ can be employed.

Among the above methods for producing the thin film, a pulsed laser deposition method by which an atmosphere oxygen pressure can be easily controlled and an epitaxial thin film having high quality can be grown is optimal for producing the thermoelectric conversion material of the present invention. It is satisfactory when a temperature at which a thin film is formed is within a range of 100° C. to 1,200° C. A growing temperature less than 100° C. is not preferable because the crystal quality of the thin film is lowered. On the other hand, a growing temperature more than 1,200° C. is also not preferable because evaporation and melting of the thin film or substrate components are caused. In these respects, the growing temperature of the thin film is necessary to be within a range of 100° C. to 1,200° C., more preferably within a range of 400° C. to 1,000° C.

As a substrate employed at this time, a bulk single crystal of $LaAlO_3$ (orientation: 100) is preferably employed.

As an n-type impurity doped into $SrTiO_3$ for forming the quantum well layer, at least one or two selected from Nb, La and Ta can be used. Although for confining electron carriers in the quantum well layer in a large amount, the larger the amount of the n-type impurity, the more preferred, it is necessary to avoid that it influences on the crystal structure of $SrTiO_3$. From such standpoints, according to the investigation of the present inventors, the amount of the doped n-type impurity is preferably sufficient for replacing 0.1 to 50% (atom) of Ti or 0.1 to 50% (atom) of Sr in $SrTiO_3$. It is more preferably 1 to 20% (atom).

As a result of doping the n-type impurity, the quantum well layer has preferably an electron carrier density of $1 \times 10^{19}$ to $5 \times 10^{21}$ $cm^{-3}$. This is because the larger the electron carrier density is, the larger the figure of merit ZT can be expected.

The thickness of the quantum well layer should be less than 4 unit lattice thickness (1.562 nm), preferably 3 unit lattice thickness or less. This is because in this range of thickness, the Seebeck coefficient increases linearly in inverse proportion to the well width (see FIG. 4, the detail will be described later).

On the other hand, the thickness of the barrier layer is not particularly limited, however, it is preferably 1 to 100 unit lattice thickness of $SrTiO_3$. When it is thinner than one unit lattice thickness, the confining of electrons becomes unstable and when it is thicker than 100 unit lattice thickness, the internal resistance becomes large, both of which are not preferred. The barrier layer has a thickness of more preferably 1 to 10 unit lattice thickness of $SrTiO_3$.

The repeating number of the barrier layer and the quantum well layer is 1 or more and can be arbitrarily set.

In the above description, Sr in $SrTiO_3$ constituting the barrier layer and the quantum well layer can be replaced by other atoms such as Ca and Ba.

For achieving ZT=1, it is necessary to make the quantum well layer extremely thin with advantageous crystallinity. Therefore, crystal materials constituting the barrier layer and the quantum well layer which are substantially the same as each other are used so that each layer is homoepitaxially grown.

The thermoelectric conversion device of the present invention is a thermoelectric conversion device containing an n-type thermoelectric conversion material and a p-type thermoelectric conversion material which are connected electrically with each other, and is characterized in that the n-type thermoelectric conversion material is an n-type thermoelectric conversion material which is the thermoelectric conversion material of the present invention. Here, as the p-type thermoelectric conversion material, known oxide semiconductor materials such as $Na_xCoO_2$ (Non-patent Document: I. Terasaki et al., Phys. Rev. B56, 12685 (1997)) and Ca—Co—O-based layered compounds (Non-patent Document: R. Funahashi et al., Jpn. J. Appl. Phys. 39, L1127 (2000)) may be used.

One end of the n-type thermoelectric conversion material is connected with one end of the p-type thermoelectric conversion material through a common electrode, and in the other end of each thermoelectric conversion material, a different electrode is formed respectively. By heating the common electrode to a high temperature and by cooling different electrodes to cause a temperature gradient between the ends of each thermoelectric conversion material, a voltage is generated between the n-type thermoelectric conversion material and the p-type thermoelectric conversion material. As a result, when a resistor is connected between the different electrodes, a current is passed and electric power can be extracted.

DESCRIPTION OF THE REFERENCE NUMERALS AND SIGNS

1 SUBSTRATE
3 QUANTUM WELL LAYER
5 BARRIER LAYER
10 THERMOELECTRIC CONVERSION DEVICE
11 n-TYPE THERMOELECTRIC CONVERSION MATERIAL
13 p-TYPE THERMOELECTRIC CONVERSION MATERIAL
20 IMAGE PRODUCING APPARATUS
30 LIGHT RECEIVING APPARATUS
31 INFRARED THERMOGRAPHY
50 VISIBLE LIGHT IMAGE SENSOR
100 IMAGE PROCESSING PART

BEST MODES FOR CARRYING OUT THE INVENTION

Thermoelectric conversion materials according to the present invention will be explained in detail below with reference to the examples.

Example

Figure 1:
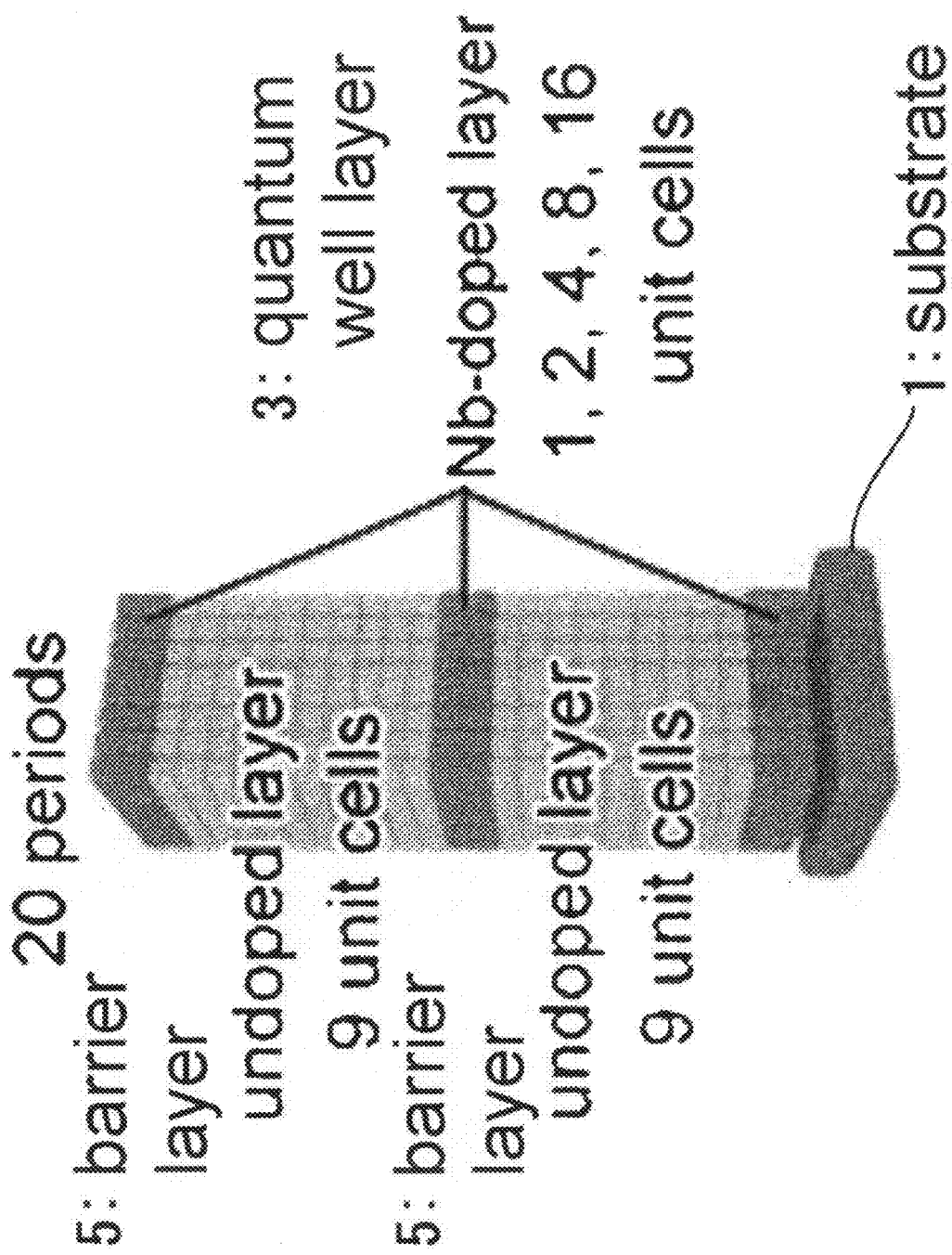
FIG. 1 is a view schematically showing a layer constitution of a thermoelectric conversion material according to an example of the present invention.

An $LaAlO_3$ bulk single crystal (orientation: 100, size: $10 \times 10 \times 0.5$ $mm^3$, manufactured by Shinkosha Co., Ltd.) of which surface has been planarized at an atomic level by a concentrated HCl treatment was used as a substrate 1 (see FIG. 1) and on the substrate, a SrTiO$_3$ thin film (barrier layer 5) and a 20%-Nb doped SrTiO$_3$ thin film (quantum well layer 3) were epitaxially-grown alternatively at a substrate temperature of 900° C. by a pulsed laser deposition method. The repeating cycle was 20 cycles. The oxygen gas pressure inside the vacuum chamber during the thin film growth was 3×10$^{-3}$ Pa. The thickness of one layer of the SrTiO$_3$ thin film 5 and the 20%-Nb doped SrTiO$_3$ thin film 3 is shown in Table 1. In addition, a SrTiO$_3$ thin film (film thickness: 100 nm) and a 20%-Nb doped SrTiO$_3$ thin film (film thickness: 100 nm) were produced under substantially the same condition for comparison.

TABLE 1

| | Film thickness of one layer (nm) | |
|---|---|---|
| | SrTiO$_3$ | 20%-Nb doped SrTiO$_3$ |
| Sample 1 | 3.51 | 0.39 (1 unit lattice thickness) |
| Sample 2 | 3.51 | 0.78 (2 unit lattice thickness) |
| Sample 3 | 3.51 | 1.56 (4 unit lattice thickness) |
| Sample 4 | 3.51 | 3.12 (8 unit lattice thickness) |
| Sample 5 | 3.51 | 6.24 (16 unit lattice thickness) |

Figure 2:
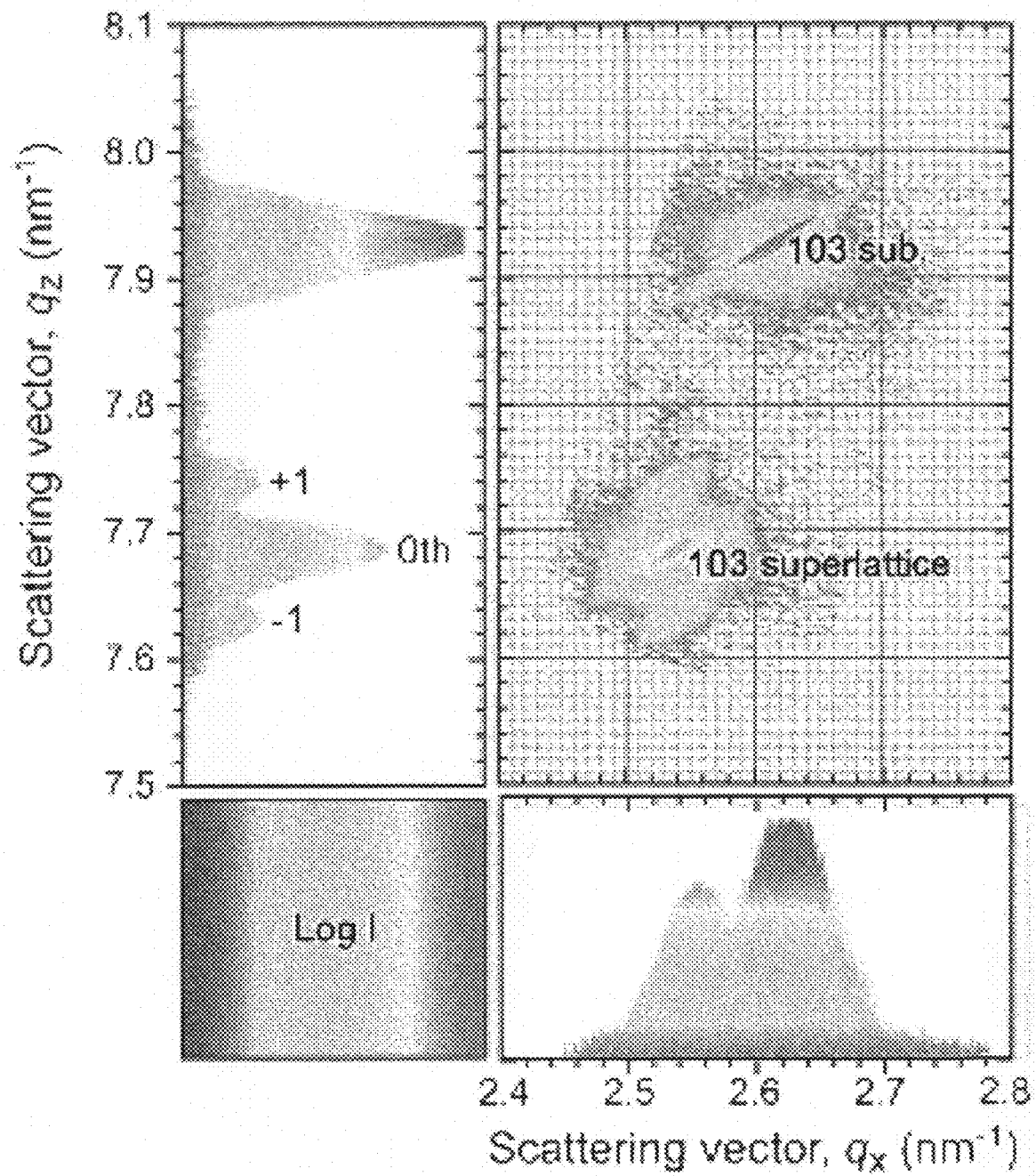
FIG. 2 shows a result of the X-ray diffraction of a quantum well layer according to the example.
Figure 3:
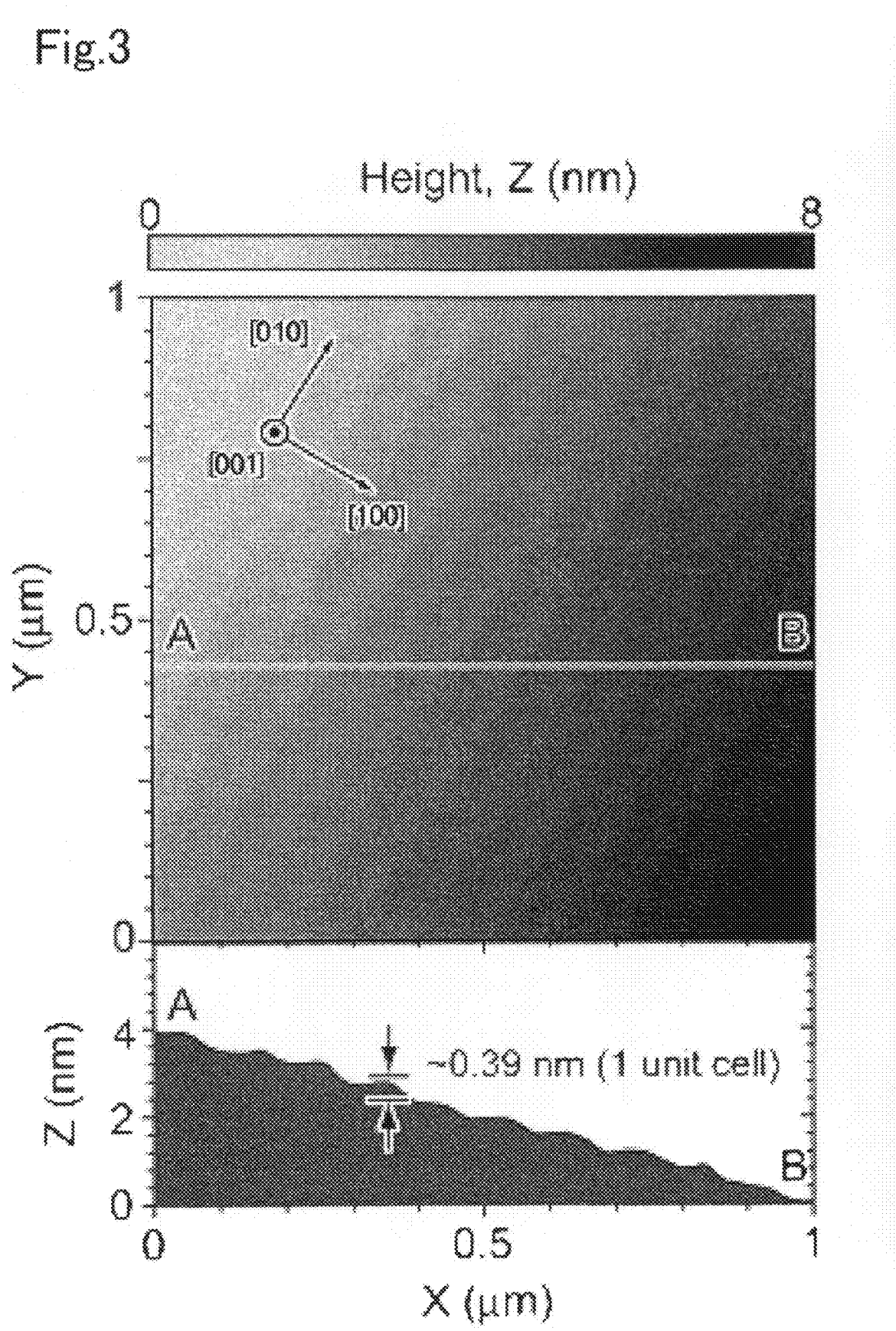
FIG. 3 shows an atomic force microscopy observation result of the quantum well layer according to the example.

The obtained thin films were examined by using a high resolution X-ray diffraction (trade name: ATX-G; manufactured by Rigaku Corporation) and a reflection high-energy electron diffraction (manufactured by Pascal Corporation), and it was ascertained that a superlattice including the SrTiO$_3$ thin film 5 and the 20%-Nb doped SrTiO$_3$ thin film 3 had been two-dimensionally epitaxially-grown on the LaAlO$_3$ substrate 1 (FIG. 2). In addition, as a result of an observation using an atom force microscope (FIG. 3), in the surface of the produced thin film, a terrace planar at the atom level with a step having a height of about 0.4 nm only was observed and it has become apparent that the thin film was epitaxially-grown while maintaining two-dimensional growth. Next, Hall effect measurement was carried out using a measuring apparatus (trade name: RESITEST 8300; manufactured by Toyo Corporation) at room temperature and it was ascertained that the produced superlattice thin film was an n-type semiconductor. In addition, the conductivities at room temperature were as shown in Table 2.

TABLE 2

| | Conductivity of whole body (Scm$^{-1}$) | Conductivity of well layer only (Scm$^{-1}$) |
|---|---|---|
| Sample 1 | 230 | 2,300 |
| Sample 2 | 420 | 2,300 |
| Sample 3 | 710 | 2,300 |
| Sample 4 | 1,080 | 2,300 |
| Sample 5 | 1,470 | 2,300 |

The SrTiO$_3$ thin film (having a film thickness of 100 nm) and the 20%-Nb doped SrTiO$_3$ thin film (having a film thickness of 100 nm) which were prepared for a comparative example at room temperature had a conductivity of respectively 1×10$^{-3}$ Scm$^{-1}$ or less and 2300 Scm$^{-1}$. As a result of measuring the Hall effect, the SrTiO$_3$ thin film (having a film thickness of 100 nm) and the 20%-Nb doped SrTiO$_3$ thin film (having a film thickness of 100 nm) had a carrier concentration of respectively the measuring limit (10$^{15}$ cm$^{-3}$) or less and 2.4×10$^{21}$ cm$^3$. Thus, it has become apparent that carrier electrons in superlattices of the Samples 1 to 5 were localized in the 20%-Nb doped SrTiO$_3$ layer 3.

Next, Seebeck coefficient measurement was carried out by applying a temperature gradient of 3 to 5 K to the both ends of the thin films at room temperature and the results shown in Table 3 were obtained.

TABLE 3

| | Seebeck coefficient ($\mu$VK$^{-1}$) |
|---|---|
| Sample 1 (1 unit lattice thickness) | −480 |
| Sample 2 (2 unit lattice thickness) | −260 |
| Sample 3 (4 unit lattice thickness) | −112 |
| Sample 4 (8 unit lattice thickness) | −112 |
| Sample 5 (16 unit lattice thickness) | −108 |

Although the Seebeck coefficients of the Samples 3 to 5 have substantially agreed with that (−108 $\mu$VK$^{-1}$) of the bulk of 20%-Nb doped SrTiO$_3$, in the Sample 1, −480 $\mu$VK$^{-1}$ which corresponds to 4.4 times that of the bulk thereof, and in the Sample 2, −260 $\mu$VK$^{-1}$ which corresponds to 2.4 times that of the bulk thereof, respectively, were obtained. This is an exhibition of a quantum Seebeck effect caused by increasing exponentially the conduction band state density of the quantum well by confining carrier electrons in a region of 4 unit cell thickness (1.56 nm) of SrTiO$_3$.

Figure 4:
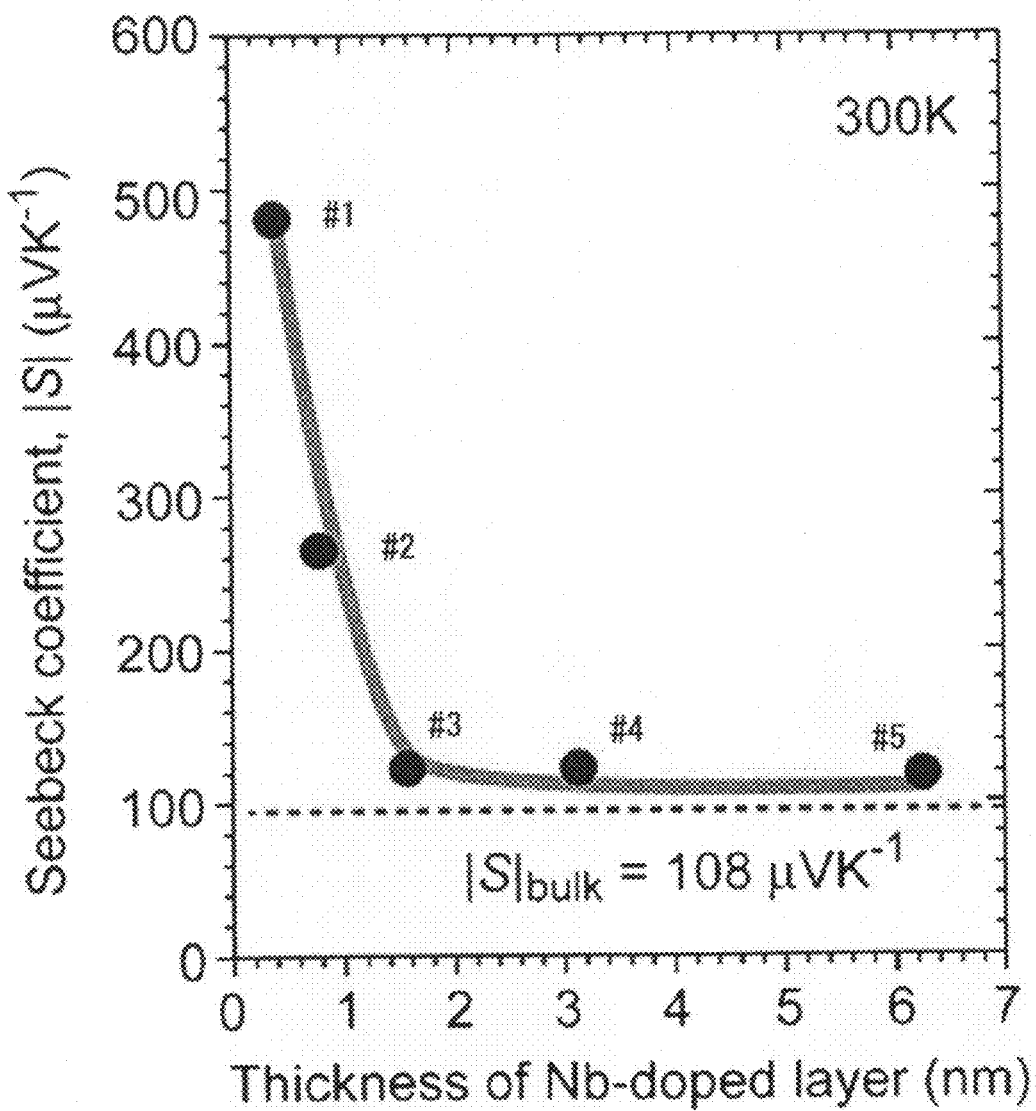
FIG. 4 shows a relationship between the thickness of the quantum well layer and Seebeck coefficients.

The results in Table 3 were shown by a graph in FIG. 4. From the results shown in FIG. 4, the quantum well layer has been determined to have a thickness of less than a 4 unit lattice thickness (1.562 nm). It is apparent that within this range of thickness, the Seebeck coefficient increases linearly in inverse proportion to the well width.

Figure 5:
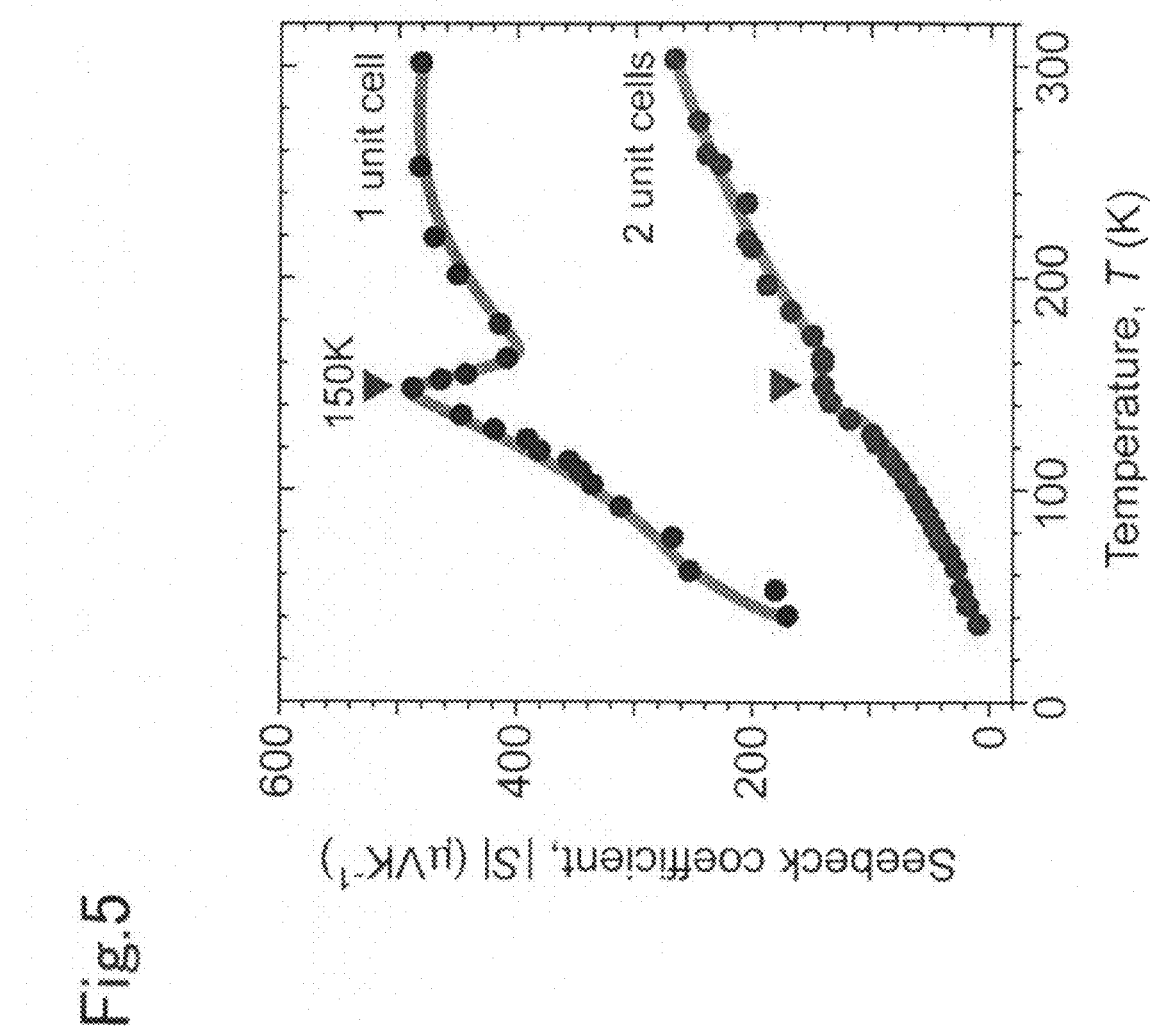
FIG. 5 shows temperature dependence of the Seebeck coefficient of a thermoelectric conversion material according to the example.

Next, the temperature dependence of the Seebeck coefficient of the superlattice thin films of the Samples 1 and 2 was measured and a peak at about 150 K was observed (FIG. 5). This is an increase of the Seebeck coefficient caused by a phonon drag effect, and from the relationship between the peak temperature of the Seebeck coefficient of a SrTiO$_3$ bulk single crystal and the carrier concentration, it has become apparent that an effective carrier concentration of the superlattice thin film is 2.4×10$^{21}$ cm$^{-3}$. Here, no apparent peak was observed in the temperature dependence of the Seebeck coefficient of the 20%-Nb doped SrTiO$_3$ thin film produced for comparison.

Here, the temperature dependence of the Seebeck coefficient (absolute value) of the thermoelectric conversion material of this example is shown. Not depending on the thickness of the well layer, a peak of the Seebeck coefficient is observed around 150 K, and in accordance with the decrease in the thickness of the quantum well layer, the peak becomes sharper. This peak is an increase phenomenon of the Seebeck coefficient due to an electron-phonon interaction which is observed at a temperature at which the electron carrier density and the lattice vibration (phonon) density become substantially the same as each other and is called the phonon drag effect. There is a linear relationship between the reciprocal of the phonon drag peak temperature and the logarithm of the electron carrier density, and the electron carrier density in the case where a peak is observed at 150 K corresponds to 2.4× 10$^{21}$ cm$^{-3}$.

The dimensionless figure of merit ZTs (room temperature 300 K) of the Samples 1 to 5 are shown in Table 4. The thermoelectric conversion figure of merit ZT of only the quantum well was 1.3 at the maximum.

TABLE 4

| | Dimensionless figure of merit ZT of whole body | ZT of well layer only |
|---|---|---|
| Sample 1 | 0.11 | 1.3 |
| Sample 2 | 0.07 | 0.39 |
| Sample 3 | 0.03 | 0.07 |
| Sample 4 | 0.01 | 0.07 |
| Sample 5 | 0.004 | 0.07 |

Figure 6:
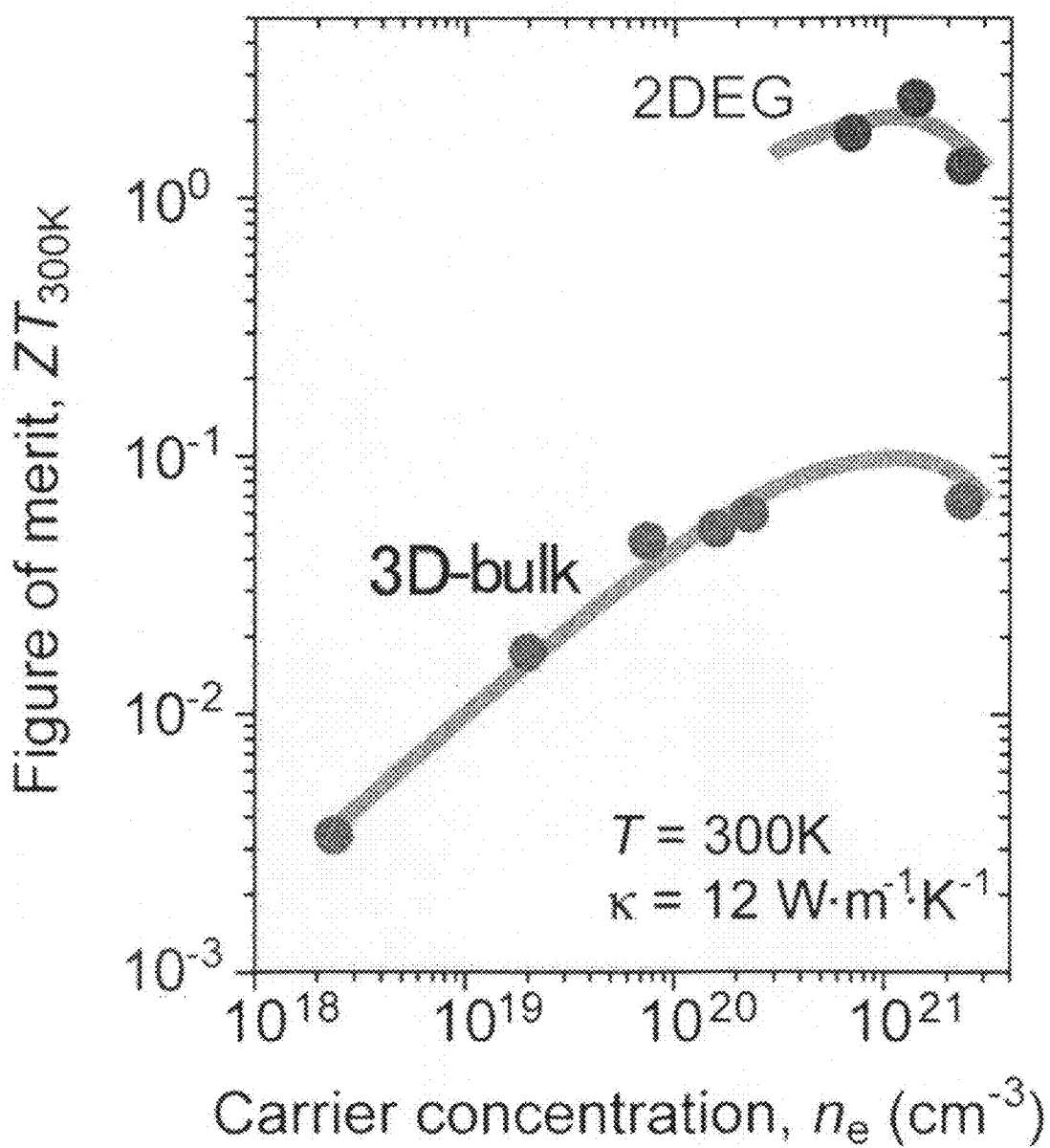
FIG. 6 shows relationships between the Seebeck coefficient and the electron carrier concentration of the thermoelectric conversion material according to the example and thermoelectric conversion material (bulk) according to a comparative example.

Next, while fixing the quantum well width at 0.39 nm, the carrier concentration of the quantum well was varied, and the figure of merit in FIG. 6 has been obtained as a result. It has become apparent that the ZT of only the quantum well reached 2.4 at the maximum.

Hereinabove, the material for the thermoelectric conversion device has been described referring to $SrTiO_3$. However, an effect characterizing the present invention, in other words, the fact that the Seebeck coefficient increases "linearly" in inverse proportion to the quantum well layer thickness (well width) is attributed to a conduction band being in the 3d orbital. Accordingly, it is considered that by any other metal oxides capable of constituting a thermoelectric conversion device in which a conduction band is in the 3d orbital, the same effect as that of $SrTiO_3$ of the present invention can be obtained. Examples of such metal oxides include $Ca_3Co_4O_9$, $A_xCoO_2$ (where A is at least one metal element selected from Na, Sr and Li and the range of x is 0.2 to 1), NiO and $ZnRh_2O_4$.

Figure 7:
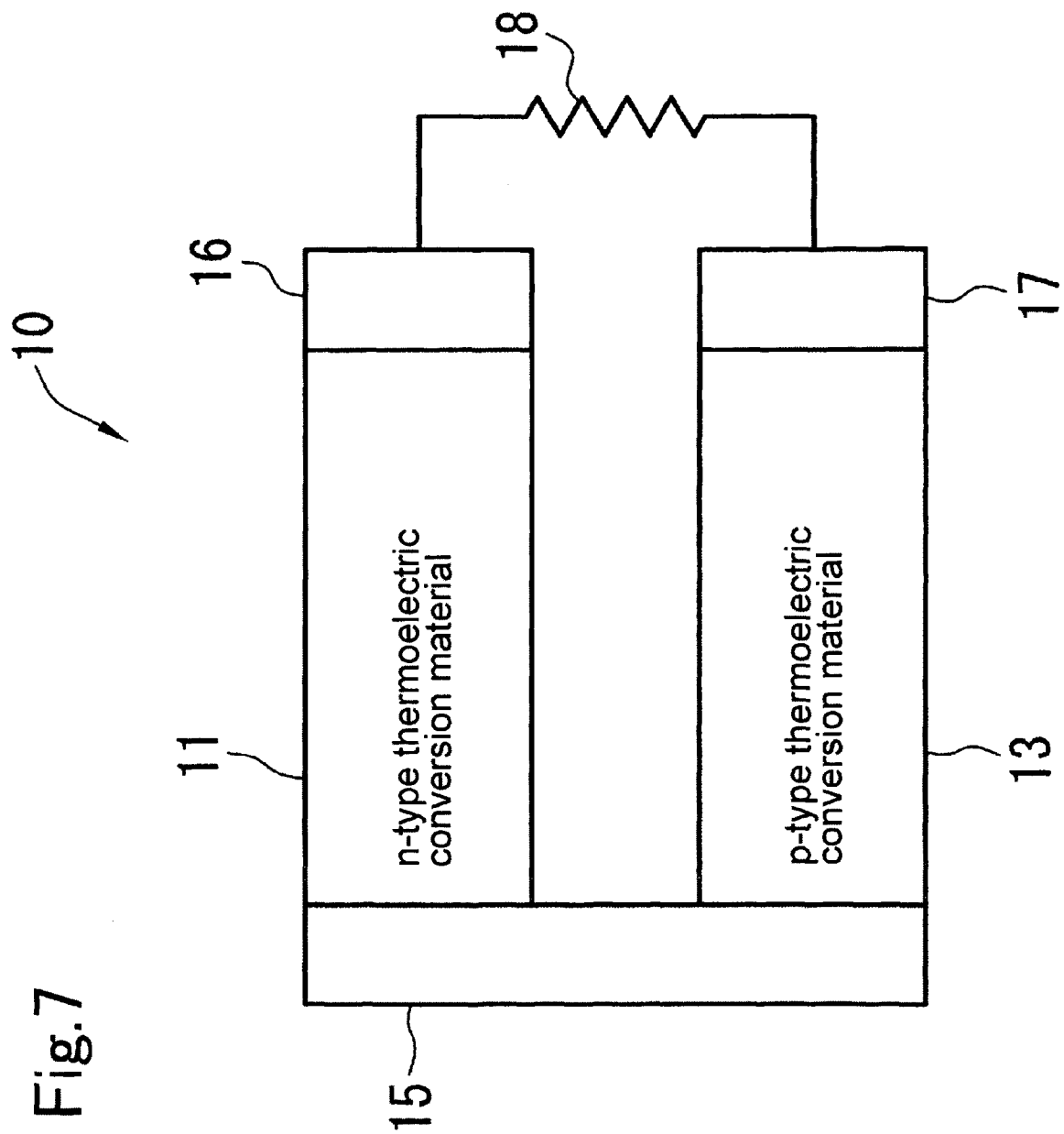
FIG. 7 shows a constitution of a thermoelectric conversion device according to the example.

FIG. 7 shows the constitution of a thermoelectric conversion device 10 according to this example.

This thermoelectric conversion device 10 includes an n-type thermoelectric conversion material 11 composed of the above-described Sample 1 and a p-type thermoelectric conversion material 13 composed of $Na_xCoO_2$. One end of the n-type thermoelectric conversion material 11 and one end of the p-type thermoelectric conversion material 13 are connected to a common electrode 15. To the other end of the n-type thermoelectric conversion material 11, an n-type electrode 16 is connected and to the other end of the p-type thermoelectric conversion material 13, a p-type electrode 17 is connected. Between the n-type electrode 16 and the p-type electrode 17, a resistor 18 is connected.

In this thermoelectric conversion device 10, for example by heating the common electrode 15 and cooling the n-type and p-type electrodes 16,17, a potential difference is caused between the n-type electrode 16 and the p-type electrode 17, and when the resistor 18 is interposed between the two electrodes, a current is passed to enable to obtain electric power.

Figure 8:
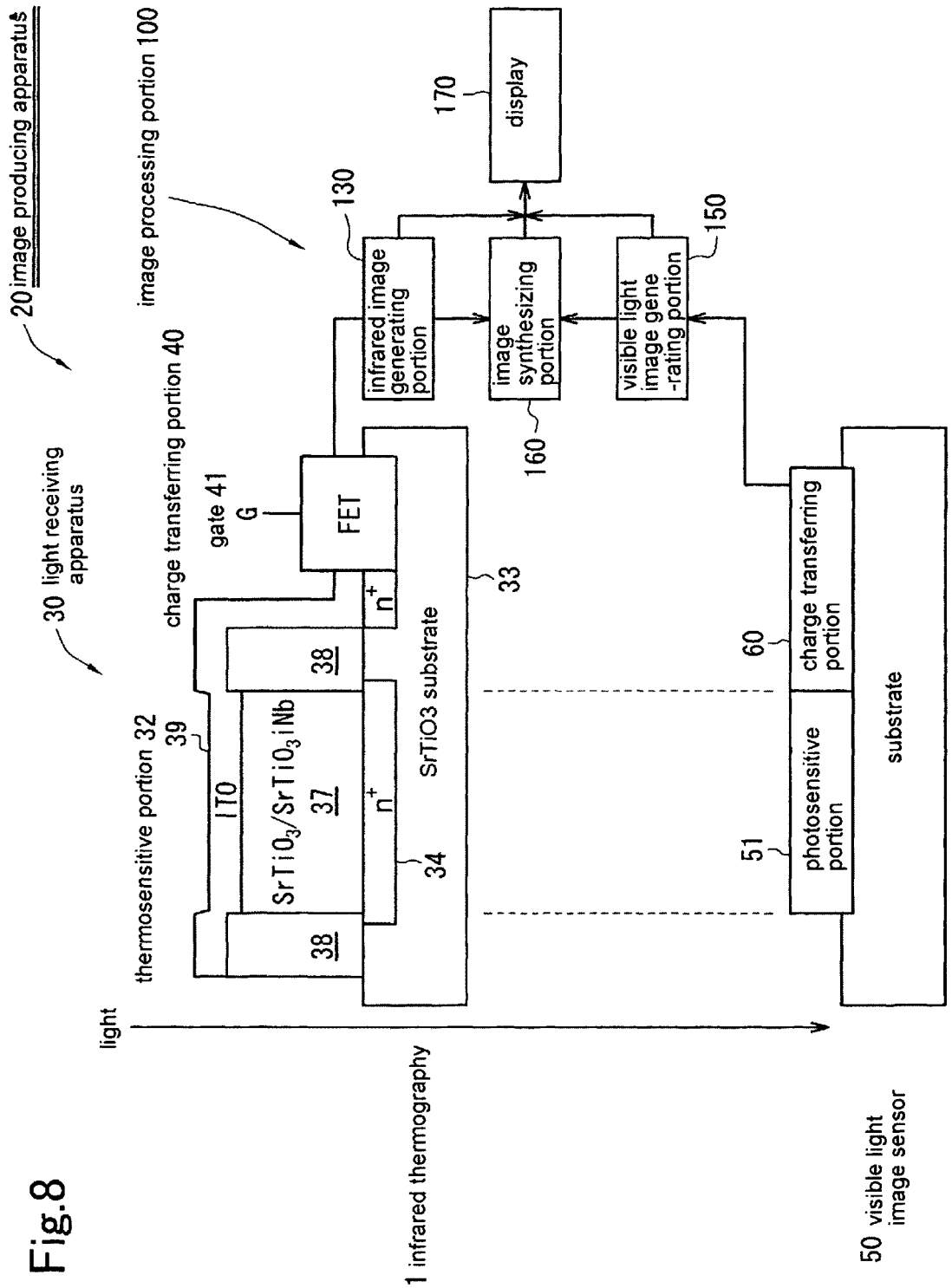
FIG. 8 shows a constitution of an image producing apparatus according to the example.

FIG. 8 shows the constitution of an image producing apparatus 20 according to this example.

This image producing apparatus 20 includes a light receiving apparatus 30 and an image processing part 100.

The light receiving apparatus 30 is constituted by stacking an infrared thermography 31 and a visible light image sensor 50.

The infrared thermography 31 includes a thermosensitive part 32 and a charge transferring part 40. The thermosensitive part 32 is produced by forming on a transparent $LaAlO_3$ substrate 33 a superlattice structure 37 produced by repeatedly stacking alternatively the $SrTiO_3$ barrier layer defined by the above-described Sample 1 and a $SrTiO_3$: Nb quantum well layer. The substrate 33 includes an n-type first conductive part 34 contacted with the superlattice structure 37. The first conductive part 34 is grounded.

On this superlattice structure 37, a transparent electrode 39 composed of ITO is formed. The numeral 38 represents a protecting layer.

When light is applied to the constituted thermosensitive part 32, a temperature gradient is caused in the superlattice structure 37 by infrared ray components in the light. In other words, an ITO 39 side of the structure 37 becomes a high temperature portion and a substrate 33 side of the structure 37 becomes a low temperature portion. As a result, a charge corresponding to the strength of the infrared ray components is generated on the ITO 39 side. In order to make the temperature gradient of the superlattice structure 37 remarkable, it is preferred to cool the substrate 33 and maintain it at a certain temperature. For example, by making a peltiert device and a thermometer contact with the reverse surface (under surface in the drawing) of the substrate 33, the temperature of the substrate 33 can be maintained constant by feedback control.

The charge generated in the ITO 39 corresponding to the strength of the infrared ray components is transferred to a charge transferring part 40 having an FET structure. The FET structure using the $SrTiO_3$ substrate 33 can be referred to Non-patent Document 7. In this FET structure, a source electrode and a drain electrode which are composed of an Al thin film are laminated on a $SrTiO_3$ substrate and further, the substrate, source electrode and drain electrode are coated with an insulating film composed of $CaHfO_3$. On the insulating film, a gate electrode composed of Al is laminated. The charge transferring part 40 transfers a charge of the ITO 39 to the image processing part 100 in response to a gate signal applied to a gate 41.

The thermosensitive part 32 constitutes each pixel of the infrared thermography 31 and each charge generated in the thermosensitive part 32 is transferred using a method used generally in an image photographing apparatus such as a CCD apparatus.

As the visible light image sensor 50, a general CCD apparatus can be used. The CCD apparatus also includes a phosensitive part 52 and a charge transferring part 60. Light which has permeated the infrared thermography 31 enters the phosensitive part 52 of the visible light image sensor 50. The phosensitive part 52 constitutes each pixel of the visible light image sensor 50. By relating the phosensitive part 52 to the phosensitive part 32 of the infrared thermography 31, an image formed based on a signal of the infrared thermography 31 and an image formed based on a signal of the visible light image sensor 50 can be conformed to each other with high accuracy.

A signal output from the charge transferring part 40 of the infrared thermography 31 is converted into an image in an infrared image generating part 130 and is displayed on a display 170. In addition, a signal output from the charge transferring part 60 of the visible light image sensor 50 is converted into an image in a visible light image generating part 150 and is displayed also on the display 170. By synthesizing an image generated by the infrared image generating part 130 and an image generated by the visible light image generating part 150 in an image synthesizing part 160, the synthesized image can be also displayed on the display 170.

By the constituted image forming apparatus 20, since the infrared thermography 31 and the visible light image sensor 50 are stacked in the light receiving apparatus 30, an image formed by the infrared thermography 31 and an image formed by the visible light image sensor 50 for the same object can be simultaneously formed.

Based on the above description, the followings are disclosed.

(1) A thermoelectric conversion material having a superlattice structure produced by laminating a barrier layer composed of an insulating metal oxide and a quantum well layer composed of the metal oxide which has been converted into a semiconductor by doping an n-type or p-type impurity therein, wherein the quantum well layer has a thickness predetermined times (preferably four times) the unit lattice thickness of the metal oxide or less; the metal oxide has a conduction band thereof in a d orbital; and the Seebeck coefficient increases linearly in inverse proportion to the thickness of the quantum well layer.

(2) A method for producing a thermoelectric conversion material including the step of forming a superlattice structure by homoepitaxially-growing on a barrier layer composed of an insulating metal oxide, a quantum well layer composed of the metal oxide which has been converted into a semiconductor by doping an n-type or p-type impurity therein, and further by homoepitaxially-growing a barrier layer composed of the insulating metal oxide on the quantum well layer, wherein the metal oxide has a conduction band thereof in a d orbital.

The present invention is not limited in any manner by the embodiments or explanations of the examples. The present invention includes various modifications that do not depart from the scope of the claims and are in a range that can be easily conceived by a person skilled in the art.

The invention claimed is:

1. A thermoelectric conversion material, comprising:
a superlattice structure produced by laminating
 a barrier layer containing insulating $SrTiO_3$, and
 a quantum well layer containing $SrTiO_3$ which has been converted into a
 semiconductor by doping an n-type impurity therein.

2. The thermoelectric conversion material according to claim 1, wherein said quantum well layer has a thickness less than 4 times the unit lattice thickness of $SrTiO_3$ which has been converted into a semiconductor by doping an n-type impurity therein.

3. The thermoelectric conversion material according to claim 2, wherein said quantum well layer has a carrier electron density of $1\times10^{19}$ $cm^{-3}$ to $5-10^{21}$ $cm^{-3}$.

4. The thermoelectric conversion material according to claim 2, wherein said superlattice structure is formed on a substrate composed of a single crystal of $LaAlO_3$ or $SrTiO_3$.

5. A light receiving apparatus, comprising:
an infrared thermography including the thermoelectric conversion material according to claim 4 as one pixel; and
a visible light image sensor for receiving light transmitted through said infrared thermography disposed under said infrared thermography.

6. The thermoelectric conversion material according to claim 3, wherein said superlattice structure is formed on a substrate composed of a single crystal of $LaAlO_3$ or $SrTiO_3$.

7. The thermoelectric conversion material according to claim 2, wherein said n-type impurity is Nb.

8. The thermoelectric conversion material according to claim 2, wherein said barrier layer has a thickness of 1 to 100 unit lattice thickness of $SrTiO_3$.

9. A thermoelectric conversion device, comprising:
an n-type thermoelectric conversion material containing the thermoelectric conversion material according to claim 2; and
a p-type thermoelectric conversion material, wherein
one end of said n-type thermoelectric conversion material and one end of said p-type thermoelectric conversion material are connected to each other through a common electrode, and
a resistor is connected between the other end of said n-type thermoelectric conversion material and the other end of said p-type thermoelectric conversion material.

10. An infrared sensor comprising the thermoelectric conversion material according to claim 2.

11. The thermoelectric conversion material according to claim 1, wherein said quantum well layer has a carrier electron density of $1\times10^{19}$ $cm^{-3}$ to $5\times10^{21}$ $cm^{-3}$.

12. The thermoelectric conversion material according to claim 11, wherein said superlattice structure is formed on a substrate composed of a single crystal of $LaAlO_3$ or $SrTiO_3$.

13. The thermoelectric conversion material according to claim 1, wherein said superlattice structure is formed on a substrate composed of a single crystal of $LaAlO_3$ or $SrTiO_3$.

14. A light receiving apparatus, comprising:
an infrared thermography including the thermoelectric conversion material according to claim 13 as one pixel; and
a visible light image sensor for receiving light transmitted through said infrared thermography disposed under said infrared thermography.

15. An image producing apparatus, comprising:
the light receiving apparatus according to claim 14; and
means for displaying simultaneously an image of said infrared thermography and an image of said visible light image sensor.

16. The thermoelectric conversion material according to claim 1, wherein said n-type impurity is Nb.

17. The thermoelectric conversion material according to claim 1, wherein said barrier layer has a thickness of 1 to 100 unit lattice thickness of $SrTiO_3$.

18. A thermoelectric conversion device, comprising:
an n-type thermoelectric conversion material containing the thermoelectric conversion material according to claim 1; and
a p-type thermoelectric conversion material, wherein
one end of said n-type thermoelectric conversion material and one end of said p-type thermoelectric conversion material are connected to each other through a common electrode, and
a resistor is connected between the other end of said n-type thermoelectric conversion material and the other end of said p-type thermoelectric conversion material.

19. An infrared sensor comprising the thermoelectric conversion material according to claim 1.

20. A method for producing a thermoelectric conversion material, comprising a step of:
forming a superlattice structure by homoepitaxially-growing, on a barrier layer containing insulating $SrTiO_3$, a quantum well layer containing $SrTiO_3$ which has been converted into a semiconductor by doping an n-type impurity therein, and further by homoepitaxially-growing a barrier layer containing insulating $SrTiO_3$ on said quantum well layer.

* * * * *